United States Patent [19]

Meyer et al.

[11] 4,006,428
[45] Feb. 1, 1977

[54] AMPLIFIER CIRCUIT HAVING INTEGRAL MEANS FOR DETECTING AND PREVENTING NON-LINEAR OPERATION

[75] Inventors: Donald G. Meyer, Mountlake Terrace; James E. Fancher, Edmonds, both of Wash.

[73] Assignee: John Fluke Mfg. Co., Inc., Mountlake Terrace, Wash.

[22] Filed: Jan. 8, 1976

[21] Appl. No.: 647,407

[52] U.S. Cl. .................................. 330/51; 330/9; 330/30 D; 330/207 P
[51] Int. Cl.² .......................................... H03F 1/14
[58] Field of Search ............... 330/9, 30 D, 51, 69, 330/207 P

[56] References Cited
UNITED STATES PATENTS

| 3,678,402 | 7/1972 | Tempel ................................. 330/9 |
| 3,891,933 | 6/1975 | Suzuki et al. ............... 330/207 P X |

*Primary Examiner*—R. V. Rolinec
*Assistant Examiner*—Lawrence J. Dahl
*Attorney, Agent, or Firm*—Christensen, O'Connor, Garrison & Havelka

[57] ABSTRACT

An amplifier circuit including provision for detecting non-linear circuit operation caused by the application of input signals that exceed either the amplifier dynamic range or the amplifier slewing capability is disclosed. The amplifier circuit includes the cascaded combination of a voltage amplifier stage, a voltage-to-current converter stage, a current limiter stage and an output stage. A first signal, obtained at the junction between a capacitor and resistor that are series connected between the signal common or ground potential and the input terminal to the output stage, is compared with a second signal obtained at the input terminal of the voltage to current converter stage. When the amplifier circuit is operating within the linear region these two signals are of equal magnitude or exhibit some other known relationship to one another. If, however, the amplifier operation is non-linear, due to either the application of an input signal of an amplitude that exceeds the linear dynamic range of the amplifier or due to an applied input signal having a time rate of change that exceeds the amplifier slew rate capability, a detectable increase in the voltage difference between the first and second signals occurs. This detected signal can be utilized for a number of functions including either disconnecting the improper input signal from the amplifier input terminals or conditioning the signal such that it lies within the linear operating range of the amplifier.

21 Claims, 3 Drawing Figures

AMPLIFIER CIRCUIT HAVING INTEGRAL MEANS FOR DETECTING AND PREVENTING NON-LINEAR OPERATION

BACKGROUND OF THE INVENTION

This invention relates to amplifier circuitry and more particularly to amplifier circuitry including means for detecting and/or preventing the application of input signals that exceed the amplifier linear operating capability.

In many situations wherein an amplifier circuit is utilized to provide signal gain, it is either advantageous or necessary to detect and/or prevent non-linear operation of the amplifier, i.e. operation in which the amplifier input and output signals are not linearly related, and hence the output signal is not a faithful reproduction of the input signal. Basically, non-linear amplifier operation can result from two distinct signal conditions. First, if the magnitude of the input signal exceeds a certain value, the amplifier will not be capable of producing an output signal equal to the magnitude of the input signal multiplied by the amplifier gain. This condition can result either from applying an input signal that exceeds the amplifier design capability, or by improperly loading the amplifier with a load impedance not within the amplifier design capability. In such an instance it is generally said that the dynamic range of the amplifier has been exceeded and that the amplifier is overloaded. The second type of non-linear amplifier operation results if the amplifier cannot produce an output signal having a time rate of change substantially identical to the product of the time rate of change of the input signal multiplied by the amplifier gain. When an input signal having a time rate of change that exceeds the amplifier capability is applied to the amplifier circuit it is generally said that the amplifier slewing capability has been exceeded or that the amplifier is slew limited.

Non-linear operation of an amplifier can cause several generally deleterious effects. For example, severe harmonic distortion may occur, large undesirable signal transients may be generated, or the amplifier gain and bandwidth may be altered. In some instances, these conditions can cause the amplifier circuit to fail due to excess voltage stress within the amplifier circuitry or due to increased thermal dissipation demands. Further, when the amplifier is utilized as a portion of a larger electronic system, non-linear amplifier operation can cause a system malfunction by the generation of undesired output signal components or can cause failure of other system components by the generation of signals that exceed their component signal handling capabilities.

One approach to eliminating the non-linear amplifier operation problem has been the design of amplifier circuits having a dynamic range and slewing capability that exceeds the requirements of the input signals that will be applied to the amplifier input terminals. Although modern amplifier circuits — especially that class of amplifier circuits generally known as operational amplifiers — exhibit performance characteristics compatable with a wide range of input signals, many applications exist in which it is not possible to design an amplifier capable of handling every type of input signal that may be encountered. Further, even though an amplifier is designed to linearly amplify all signals that normally arrive at the input terminals, certain conditions can occur in which an input signal not within the linear range of the amplifier reaches the amplifier circuit. For example, in amplifiers utilized within electronic systems or electronic test instruments, even a skilled operator can inadvertently connect or operate the equipment such that the amplifier receives an improper input signal.

Prior art attempts to protect an amplifier when an improper input signal is applied have generally included clamping circuits to limit the signal voltage at one circuit point or another and have also included current-activated switches to disable the amplifier circuit or modify its operation when predetermined limits are exceeded. Although such attempts have been successful to some degree, several disadvantages have been encountered. First, those circuits that dynamically respond to non-linear operation often have not been fast enough to sense the nonlinear operation and apply corrective measures such as removing or reducing the input signal before a harmful output signal has been generated. Secondly, those circuits that rely on limiting the signal flowing through the amplifier often themselves exhibit non-linear transfer characteristics and, accordingly can be utilized only by adversely influencing the performance characteristics of the basic amplifier circuit. Thirdly, the prior art has not provided a non-linear operation system applicable for use with amplifier circuits comprising various circuit stages realized by silicon integrated circuits. This consideration is of prime importance since in many instances, the most expedious and economical amplifier design is accomplished with commercially available integrated circuits that can be used as "building blocks" to provide the desired input-output relationship. Nor has the prior art provided circuit means for detecting non-linear amplifier operation that is amenable to realization within an integrated circuit amplifier.

Accordingly it is an object of this invention to provide an amplifier circuit including means for detecting non-linear operation of the amplifier.

It is another and related object of this invention to provide an operational amplifier circuit that includes circuitry for producing an electrical signal indicative of whether the applied amplifier input signal exceeds the dynamic range and/or the slewing capability of the amplifier.

It is yet another object of this invention to provide an amplifier circuit that includes the detection and utilization of non-linear circuit operation such that the input signal is removed or reduced prior to the generation of substantial non-linear output signals.

It is still another object of this invention to provide an amplifier circuit including the detection of non-linear amplifier operation that is amenable to realization by the use of circuit stages including integrated circuits and is also amenable to realization as an integrated amplifier circuit including such non-linear detection means.

SUMMARY OF THE INVENTION

These and other objects are achieved in accordance with this invention by an amplifier circuit including the cascaded combination of a voltage amplifier stage, a voltage-to-current converter stage, a current limiter stage and an output amplifier stage. A first capacitor is connected between the input terminal of the output stage and a terminal of fixed potential, e.g., circuit ground. Since during linear circuit operation the power amplifier stage has a high input impedance, essentially all of the current flowing from the current limiter stage flows through the first capacitor.

In some embodiments of the invention a detectable signal indicative of non-linear amplifier operation is obtained at a point between a first detection terminal that is connected to the input terminal of the voltage-to-current converter stage and a second detection terminal that is connected to the circuit node between a second capacitor and a resistor that are serially connected between the output terminal of the output stage and a terminal of fixed potential such as circuit ground. In other embodiments of the invention, a resistor is connected in series between the first capacitor and the terminal of fixed potential, with the junction between the first capacitor and resistor connected to the second detection terminal. In either case, the signal coupled to the second detection terminal is directly proportional to the current flow through the first capacitor. Generally, the value of the resistor in each of these embodiments is established substantially equal to the reciprocal of the transconductance of the voltage to current converter stage (or some multiplicative value thereof) to produce a signal between the two detection terminals that are substantially equal to zero whenever the amplifier is operating in a linear fashion.

In this arrangement, the amplifier maximum slew rate is determined by the maximum current parameter of the current limiter stage and the value of the first capacitor. If an input signal is applied to the amplifier input terminal that exceeds this slewing capability, the current flowing from the current limiter stage is less than that current which would result if the amplifier circuit were operating linearly. Thus when the amplifier circuit is operating nonlinearly due to an applied signal that exceeds the maximum output signal slew rate, the signal coupled to the second detection terminal is lower in magnitude than that signal which would appear at the second detection terminal if the particular input signal was within the amplifier slewing capability. The signal appearing at the first detection terminal is not affected, however, and accordingly, a detection signal is supplied between the first and second detection terminals to indicate the nonlinear amplifier operation.

Further, if an input signal is applied to the amplifier circuit that causes the output amplifier stage to overload, the magnitude of the signal coupled to the second detection terminal deviates from the magnitude of the signal that would be developed if the output stage were operating linearly. This condition occurs since, during overload of the output stage, a portion of the current limiter output signal either flows into the input terminal of the output amplifier stage, or additional current flows from the input terminal of the output stage and through the first capacitor.

One disclosed embodiment of the invention includes an analog switch connected between the amplifier input terminal and the input terminal to the voltage amplifier stage. The analog switch is controlled such that an input signal is connected to the voltage amplifier stage as long as the amplifier circuit is operating linearly and is disconnected therefrom whenever non-linear operation occurs. In this embodiment, the analog switch control signal is derived from the signal appearing between the first and second detection terminals by a voltage comparator circuit that triggers a monostable multivibrator each time non-linear operation occurs.

The output signal of the monostable multivibrator activates the analog switch to disconnect the input signal for a period of time sufficient for the amplifier output signal to slew to the quiescent potential, and then slowly returns the analog switch to the conducting stage so that the slew rate limit will not be exceeded by the sudden application of an input signal that is within the amplifier linear range.

DETAILED DESCRIPTION

Figure 1:
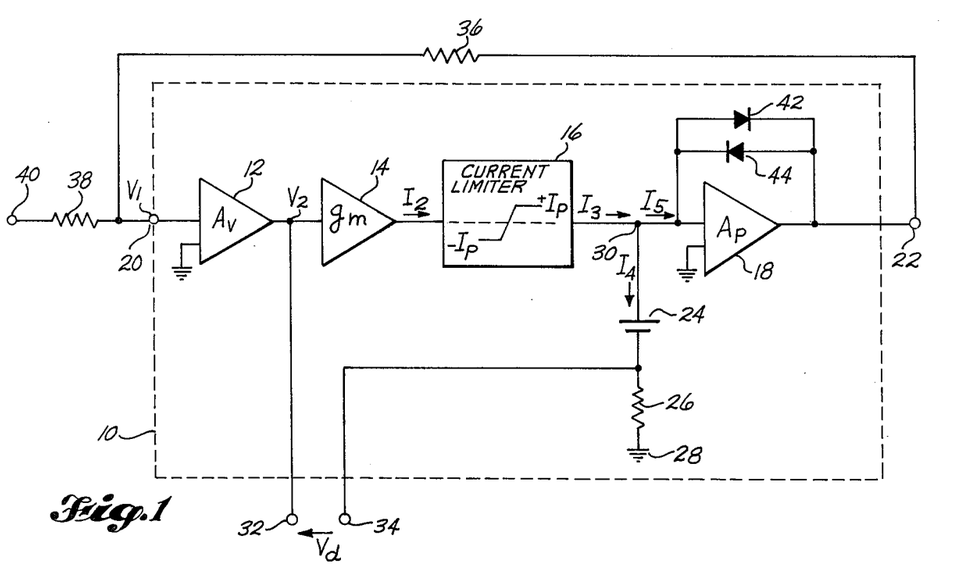
FIG. 1 is a block diagram depicting an embodiment of an amplifier circuit in accordance with this invention.

As shown in FIG. 1, the operational amplifier of this invention (generally denoted by the numeral 10) includes a voltage amplifier stage 12, a voltage-to-current converter stage (E-I converter) 14, a current limiting stage 16 and an output stage 18 that are respectively connected in cascade between an input terminal 20 and an output terminal 22. A capacitor 24 and a resistor 26 are serially connected between a terminal of fixed potential such as circuit ground 28 and a circuit node 30 at the interconnection between the current limiting stage 16 and the output stage 18. A first detection terminal 32 is connected to the interconnection between the voltage amplifier stage 12 and the E-I converter stage 14 and a second detection terminal 34 is connected to the interconnection between the capacitor 24 and the resistor 26. As shall be discussed hereinafter, this circuit arrangement produces a detectable electrical signal between detection terminals 32 and 34 that is indicative of whether the amplifier 10 is operating in a linear or non-linear fashion.

In a conventional manner, the overall gain of the operational amplifier 10 is determined by a feedback network connected between the amplifier output terminal 22 and the amplifier input terminal 20. In FIG. 1, the feedback network is formed by a resistor 36 connected between the amplifier input and output terminals (20 and 22, respectively) and a resistor 38 connected between the amplifier input terminal 20 and a terminal 40 to establish the overall circuit gain substantially equal to $R_{36}/R_{38}$. In operation, a signal voltage voltage is applied to terminal 40 and the amplified output signal is derived at amplifier output terminal 22.

Voltage amplifier stage 12 can be any one of numerous conventional amplifier circuits that are configured to provide a high input impedance and a low output impedance with a predetermined voltage gain (denoted as $A_v$ in FIG. 1). The E-I converter 14 is a conventional electronic circuit configured to provide an output current substantially equal to the voltage applied to the circuit input multiplied by the circuit transconductance $(g_m)$. The current limiter stage 16 is an electronic circuit that supplies an output current substantially equal to a positive current, $+I_p$, for all positive input currents greater than or equal to $I_p$, supplies a negative current $-I_p$ for all negative currents of a magnitude greater than $I_p$, and supplies an output current substantially identical (or linearly proportional to) to the input current for all input currents within the output current range $-I_p$ to $+I_p$. The output stage 18 is a conventional electronic amplifier circuit that has an input impedance substantially higher than the impedance of capacitor 24 at all frequencies within the bandpass of amplifier 10. Functionally speaking, output stage 18 provides the power gain necessary to drive a load impedance (not shown in FIG. 1) that is connected to the amplifier output terminal 22. Generally, the output stage 18 saturates at predetermined voltages when an applied input signal exceeds the output stage linear range and the output stage 18 enters a current limiting mode when an applied signal exceeds the output stage signal current capability. Often output stage 18 will have a unity voltage gain, in which case the output stage 18 is commonly referred to as a buffer stage. Diodes 42 and 44, oppositely poled and connected in parallel between the input and output terminals of the output stage 18 are examples of protection devices that conduct only during non-linear operation of the output stage 18. Other output stages that can be utilized in the amplifier of this invention can include other electronic components as protective devices or may not include such protective devices at all. In any case, the output stage 18 is characterized in that during non-linear operation thereof, current flows either into or out of the output stage input terminal.

It should be noted that the maximum current output of the current limiter stage 16 and the value of capacitor 24 determine the maximum slew rate of the output signal developed by the amplifier 10. Specifically, since the maximum value of the current flowing from the current limiter stage 16 is $\pm I_p$, the maximum rate of change in the voltage coupled to the input terminal of output stage 18 is $I_p/C_{24}$, where $C_{24}$ is the capacitance value of capacitor 24. Accordingly, the maximum time rate of change of the output signal of amplifier 10 is $A_pI_p/C_{24}$ where $A_p$ is the voltage gain of the output stage 18.

In the practice of this invention, it is generally required that the dynamic ranges of the voltage amplifier stage 12 and the output stage 18 be established such that the voltage amplifier stage is linear throughout the linear amplification range of the output stage 18. Secondly, it is generally required that the E-I converter 14 be capable of producing a transconductance output signal over a current range exceeding the range $-I_p$ to $+I_p$. With the amplifier 10 configured to comply with these conditions, non-linear operation arising from the application of an input signal exceeding the dynamic range of the amplifier 10 will be caused by non-linear operation of the output stage 18 and non-linear operation of the amplifier 10 arising from the application of an input signal exceeding the output signal slewing capability of the amplifier 10 will cause current limiting to occur within current limiter stage 16. As shall be ascertained upon understanding the operation of this invention, either of these conditions produces a detectable signal between detection terminals 32 and 34.

The linear operating characteristics of amplifier 10, and the fact that the amplifier 10 functions as an operational amplifier, can be readily ascertained by examining the circuit of FIG. 1. It can been seen in FIG. 1 that, as long as the current limiter stage 16 receives an input current of magnitude less than $I_p$, the open loop voltage gain of the amplifier 10 is $$V_o/V_1 = A_v G_m A_p (R_{26} + 1/SC_{24}) \text{ where}$$

$A_v$ is the voltage gain of the voltage amplifier stage 12; $g_m$ is the transconductance of the E-I converter stage 14; $A_p$ is the voltage gain of the output stage 18; $s$ is the Laplacian frequency operator; and, $R_{26}$ and $C_{24}$ are the resistance and capacitance values of resistor 26 and capacitor 24. Thus, if the reactance of the capacitor 24 is much greater than the resistance value of resistor 26, it can be recognized that amplifier 10 exhibits a voltage gain $$V_o/V_1 = A_v g_m A_p / sC_{24}$$

Accordingly, it can be seen that appropriately establishing the product $A_v g_m A_p$ and establishing the value of capacitor 24 in view of the input impedance of output stage 18 to provide a desired bandwidth (and resulting 6db/octave gain roll off characteristic) provides the operating characteristics associated with a conventional operational amplifier circuit.

With the basic circuit configuration of the embodiment of FIG. 1 in mind, the operation of this invention to produce a signal indicative of whether the amplifier 10 is operating in a linear or non-linear manner can be now be understood. First, when a signal $V_1$ is applied to the amplifier input terminal 20 that does not exceed either the amplifier dynamic range or slew capability, it can been seen from FIG. 1 that the signal, $V_2$, coupled to the first detection terminal 32 is equal to $A_v V_1$. Since the amplifier slewing capability is not exceeded, the output current flowing from the current limiter stage 16 and into the circuit node 30 is substantially equal to $V_2 g_m$. Further, since the output stage 18 is not operating nonlinearly and the input impedance of output stage 18 is substantially greater than the impedance of the capacitor 24, the current $I_5$ flowing from circuit node 30 into the input terminal of the output stage 18 is substantially equal to 0. Accordingly, the current $I_4$ flowing from node 30 into the series connected capacitor 24 and resistor 26 is identically equal to $g_m V_2$ and the voltage at detection terminal 34 is equal to $V_2 g_m R_{26}$. Thus the signal appearing between detection terminals 32 and 34 is $V_d = V_2 (1 - g_m R_{26})$ and, if the value of resistor 26 is established equal to the reciprocal of the transconductance $g_m$, the detection signal is substantially equal to 0 during linear operation of the amplifier 10.

When a positive input signal, $V_1$, that exceeds the maximum amplifier slewing rate $I_p/C_{24}$ is applied to the amplifier input terminal 20, the voltage at detection terminal 32, $V_2$, is again equal to $A_v V_1$. However, as previously noted when the amplifier slewing capability is exceeded, the magnitude of the current flowing from the current limiter stage 18 and to circuit node 30 is limited to $+I_p$. Accordingly, the voltage developed at detection terminal 34 is $I_p R_{26}$. Since $I_p$ is less than the magnitude of $V_2 g_m$ by some current differential, $di$, the voltage appearing between detection terminals 32 and 34 can be shown to be $V_d = V_2 (1 - R_{26} g_m) + di R_{26})$ or in the instance in which the value of resistor 26 is equal to the reciprocal of the transconductance of the E-I converter stage 14, the detection voltage can be expressed as $di/g_m$ which can alternatively be expressed as $V_1 A_v - I_p/g_m$.

In any case, it can be recognized that a detection signal $V_d$ is developed between detection terminals 32 and 34 that indicates the nonlinear operation of amplifier 10 resulting from the application of a positive input signal that would otherwise require the amplifier output voltage to slew at a rate exceeding the maximum slew capability $I_p/C_{24}$. Further, it can be recognized that the amplifier circuit 10 operates in a similar manner when a negative input signal exceeding the maximum negative slew rate $-I_p/C_{24}$, with the polarity of the detection signal developed between detection terminals 32 and 34 reversed from the polarity of the signal developed by a positive input signal.

When an input signal, $V_1$, applied to the amplifier input terminal 20 does not exceed the amplifier slew rate capability, but instead causes non-linear operation of the output stage 18, the signal coupled to detection terminal 32 is again $V_2 = V_1 A_v$ and the current limiter stage supplies a current of $g_m V_2$ to circuit node 30. The nonlinear operation of the output stage 18, however, causes a current $I_5$ to flow between the circuit node 30 and the input terminal of the output stage 18. The current $I_5$ results from current flow through the diode 42 and/or the diode 44, or results from current flowing into or out of the input terminal of output stage 18. Accordingly, the current $I_4$, flowing through series connected capacitor 24 and 26, is not equal to $g_m V_2$, but is equal to $g_m V_2 - I_5$, with the direction of the current flow $I_5$ assumed to be into the input terminal of the output stage 18. Thus the voltage appearing between the detection terminals 32 and 34 can be shown to be $V_d = V_2 (1 - R_{26} g_m) + I_5 R_{26}$, or in an embodiment in which $R_{26}$ is established equal to the reciprocal of the transconductance $g_m$, $V_d = I_5 R_{26}$. In any case it can be seen that a detectable signal indicative of the nonlinear operation of amplifier 10 resulting from the application of an input signal which exceeds the amplifier linear range is supplied between terminals 32 and 34.

It should be recognized that the practice of this invention is not limited to the specific embodiment depicted in FIG. 1. For example, the first detection terminal 32 in the embodiment of FIG. 1 could be connected to the input terminal 20 rather than the output terminal of the voltage amplifier stage 12. In such an embodiment, the previously described signals appearing between detection terminals 32 and 34 would be increased by a multiplicative factor of $A_v$.

Figure 2:
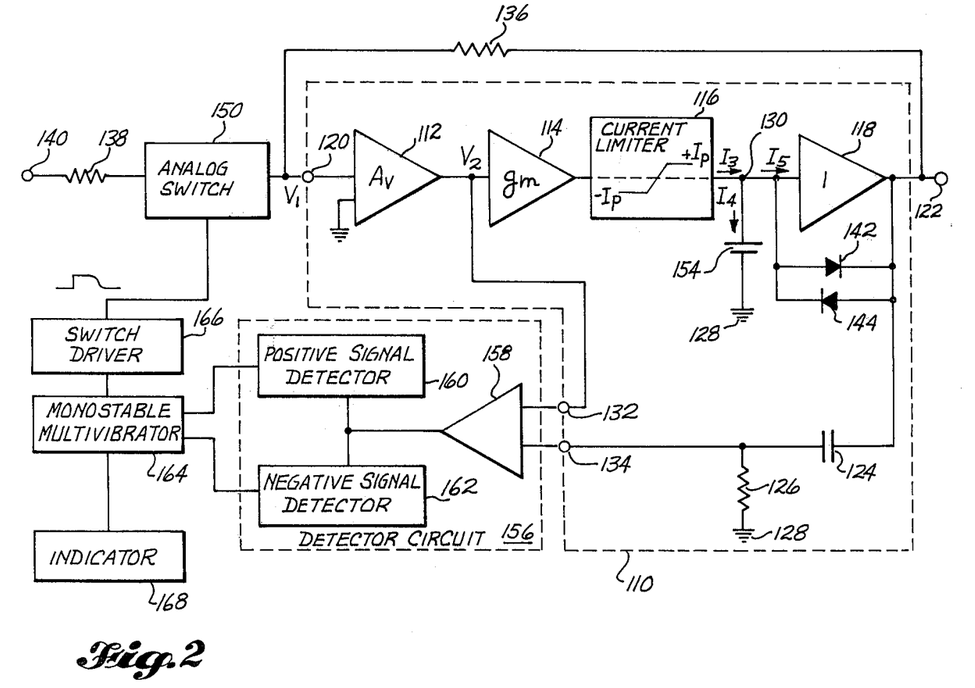
FIG. 2 is a block diagram of an embodiment of this invention that includes an analog switch and associated drive circuitry for disconnecting the input signal to the amplifier whenever non-linear amplifier operation occurs.

An embodiment of this invention configured to detect the nonlinear operation in the previously described manner, and to interrupt the amplifier input signal during periods of nonlinear amplifier operation is depicted in FIG. 2. In this embodiment, the operational amplifier 110 includes a voltage amplifier stage 112, a E-I converter stage 114, a current limited stage 116, and a unity gain output stage 118 respectively connected in cascade between a signal input terminal 120 and an amplifier output terminal 122. As discussed relative to the embodiment of FIG. 1, the combination of these stages functions as an operational amplifier with a capacitor 154, connected between the output terminal of current limiter 116 and circuit ground 128, determining the maximum slew rate. Input signals are coupled to the signal input terminal 120 of the operational amplifier 110 via a resistor 138 and an analog switch 150 that are series connected between an input terminal 140 and the amplifier signal input terminal 120. Analog switch 150 is a conventional device or circuit that is effectively a variable resistance responsive to a control signal applied to the switch control terminal 152 such that the device resistance is proportional to the magnitude of the control signal. Preferably, analog switch 150 can be controlled between a conducting state exhibiting a low resistance value that approximates an electrical short circuit and a nonconducting state exhibiting a high resistance value that approximates an electrical open circuit.

Since the resistance of analog switch 150 is effectively in series with resistor 138 (relative to the feedback network that determines the overall circuit gain), the signal gain between the signal input terminal 140 and the output terminal 122 is equal to $R_{136}/(R_{138}+R_s)$, where $R_s$ is the conduction state resistance of the analog switch 150. Accordingly, if the conduction state resistance of the analog switch 150 is substantial relative to the value of resistor 138, the factor $R_s$ should be considered in establishing the overall circuit gain.

In the embodiment of FIG. 2, a first detection terminal 132 is connected to the output terminal of the voltage amplifier stage 112. A second detection terminal 134 is connected to the junction between a resistor 126 and a capacitor 124, with the capacitor 124 and resistor 126 series connected between the output terminal of the output stage 118 and circuit ground 128. The detector arrangement of this embodiment differs from that of the circuit embodiment of FIG. 1 in that the second detector terminal 34 in FIG. 1 is connected to the input terminal of the output stage 118. The embodiments of FIGS. 1 and 2 both operate in the previously described manner since the current flow through capacitor 124 is related to the current flow through the capacitor 154 by a multiplicative factor equal to the gain of output stage 118. The embodiment of FIG. 2 is advantageous in situations in which capacitor 154, connected between the input terminal of the output stage 118 and the circuit ground 128 must be comprised primarily or solely of stray capacitance (3.g. distributed wiring capacitance) in order to obtain the desired maximum amplifier slew rate capability $I_p/C_{154}$. For simplicity, it is assumed in the following circuit description that the capacitance value of capacitor 124 is equal to the capacitance value of capacitor 154. Unequal capacitance values can be employed as long as $$C_{124} R_{126} = C_{154}/g_m.$$

The detection terminals 132 and 134 are connected to the input terminals of a detector circuit 156 that produces an output signal each time the signal appearing between the detector terminals 132 and 134 indicates that the amplifier 110 is operating nonlinearly. Preferably, the resistance of resistor 128 is established equal to the reciprocal of the transconductance $g_m$, of the E-I converter stage 114 so that a non-zero signal appears between detection terminals 132 and 134 only when the operation of amplifier 110 is nonlinear.

In the detector circuit arrangement of FIG. 2, this detection signal is amplified by a conventional differential amplifier 158 and the differential amplifier output signal is coupled to a positive signal detector 160 and a negative signal detector 162. Signal detectors 160 and 162 are conventional circuits such as voltage comparator that supply an output signal in response to an input signal exceeding a predetermined threshhold value or reference signal. The output terminals of detectors 160 and 162 are connected to the trigger input terminal of a conventional monostable multivibrator circuit 164. The monostable multivibrator 164 is configured to produce a generally rectangular pulse of a predetermined time interval each time either detector 160 or 162 is activated in response to the detection signal produced between terminals 132 and 134.

The output of the monostable multivibrator 164 is connected to a switch driver circuit 166 that is configured to supply an appropriate control signal to the control terminal 152 of the analog switch 150. For example, in an embodiment in which the analog switch is normally in a conductive state, the switch driver 166 supplies a signal that will rapidly drive the analog switch into the nonconducting state for a period of time essentially equal to the duration of the monostable multivibrator output signal. Generally, the duration of the monostable multivibrator output signal is established long enough to permit the amplifier output signal to slew to the quiescent output voltage. The output signal from the switch driver circuit 166 is also generally established such that the analog switch 150 does not instantaneously switch back from the nonconducting state into the conducting state. Such a more or less gradual return of the analog switch 150 to the conducting state ensures that the circuit embodiment of FIG. 2 will operate properly should a DC input signal (or a time-varying signal having a non-zero value at the time the analog switch is switched to the conducting state be applied to the input terminal 140. The rapid application of such a signal to the amplifier input 120 by the analog switch 150 requires an essentially infinite output slewing rate for the amplifier to operate linearly and would hence cause a detection signal to be supplied between terminals 132 and 134 with the concomitant triggering of the monostable multivibrator 164 and the switching of the analog switch 150 to the non-conductive state. If the analog switch 150 abruptly returned to the conducting state at the termination of the monostable multivibrator output pulse, the input signal would again demand a slewing rate exceeding the maximum amplifier slew rate and analog switch 150 would be switched back into the nonconducting state. This process would continue indefinitely with respect to a DC input signal and would continue with respect to a time-varying signal until such time that the switching of the analog switch 150 coincided with an input signal zero crossover. Accordingly, the switch driver circuit output signal is controlled such that the signal applied to the amplifier input terminal 120 when the analog switch 150 switches between the nonconductive and conductive states cannot cause the cannot output signal to exceed the maximum slew rate $I_p/C_{154}$.

Additionally in FIG. 2, the output of the monostable multivibrator 164 is connected to an indicator 168. Indicator 168 is a conventional device such as an audible alarm or indicator lamp that can be included in embodiments of the invention in which it is necessary or desirable to alert attending personnel of the amplifier non-linear operation.

In view of the foregoing description of the circuit embodiment of FIGS. 1 and 2, it can be recognized that the circuit of FIG. 2 automatically interrupts the amplifier input signal each time that an applied signal exceeds either the maximum output signal slewing rate or the amplifier dynamic range and will periodically return the amplifier to an operational state at a rate determined by the period of the signal supplied by monostable multivibrator 164 until the input signal is reduced to a value resulting in linear operation of amplifier 110.

Figure 3:
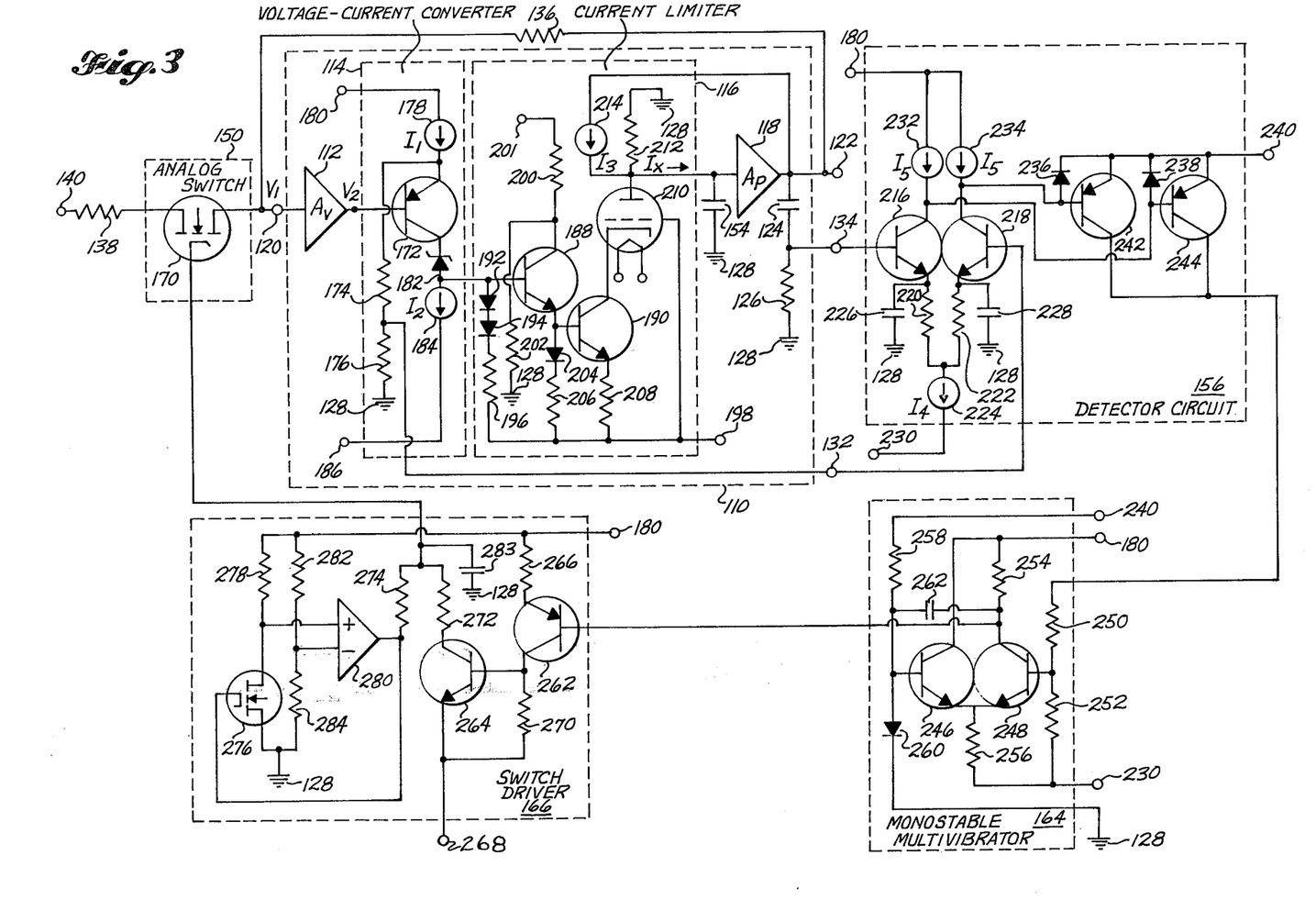
FIG. 3 schematically illustrates one realization of the embodiment of this invention depicted in FIG. 2.

One realization of the embodiment of this invention depicted in FIG. 2, designed for use as a precision linear amplifier capable of developing output voltages on the order of 1,000 volts RMS, is depicted in FIG. 3. In this embodiment a metal oxide field effect transistor (FET) 170 of the N channel enhancement mode variety is utilized as analog switch 150. As is known in the art, an N channel enhancement mode FET exhibits a low resistance between the device drain and source electrodes whenever a positive control voltage is applied to the device gate electrode and exhibits a very high drain to source resistance when the potential at the gate electrode is negative or substantially zero.

The E-I converter stage 114 of the embodiment of FIG. 3 includes a single transistor 172 with the base electrode connected to the output terminal of the voltage amplifier stage 112. Resistors 174 and 176 are series connected between ground potential 128 and the emitter electrode of transistor 172. In addition, a transistor current source 178 that generates a substantially constant bias current, $I_1$, is connected between a bias terminal 180 and the emitter electrode of transistor 172. The collector electrode of transistor 172 is connected to the cathode of a zener diode 182, with the anode of zener diode 182 connected to the input terminal of the current limiter stage 116. A second transistor current source 184 that supplies a substantially constant bias current, $I_2$, is connected between the anode of zener diode 182 and a bias terminal 186. The resistance values of resistors 174 and 176 are established such that substantially all of the current $I_1$ supplied by current source 178, flows through the collector-emitter path of transistor 172. Further, the current supplied by current source 184 is established such that $I_1$ is greater than $I_2$.

In operation, a signal, $V_2$, coupled to the base electrode of transistor 172 from the output of voltage amplifier stage 112 develops a signal at the emitter electrode of transistor 172 that is substantially equal to the output voltage of the voltage amplifier stage 112. Accordingly, a signal proportional to the voltage $V_2$ is coupled to the first detection terminal 132 via voltage divider resistors 174 and 176. As signal current flows through transistor 172, a current substantially equal to the emitter current of transistor 172 minus the current $I_2$ is coupled to the input terminals of the current limiter stage 116. Since the minimum current flow through the zener diode 182 is $I_2$, the zener diode will be maintained in avalanche operation for all signal conditions and hence the zener diode does not cause distortion in the signal current flowing from the E-I converter 114.

The current limiter stage 116 includes transistors 188 and 190. The base electrode of transistor 188 is connected to the output terminal of the E-I converter stage 114. Resistor 196 and diodes 192 and 194 are series connected between a bias terminal 198 and the base electrode of transistor 188 to supply bias voltage to transistor 188. The zener diode 182 of the E-I converter stage 114 is selected to supply the necessary DC level translation between the bias potential at the collector electrode of transistor 172 and the bias potential for the current limiter stage 116 at bias terminal 198. Resistors 200 and 202 are series connected between a bias terminal 201 and the circuit ground 128. The junction between resistor 200 and resistor 202 is connected to the collector electrode of transistor 188 to establish the maximum DC collector potential. The base electrode of transistor 190 is connected to the emitter electrode of transistor 188. Diode 204 and resistor 206, series connected from the electrode of transistor 188 to bias terminal 198, maintain transistor 188 in an operating region having substantially high beta. The emitter electrode of transistor 190 is connected to bias terminal 198 via resistor 208 and the collector electrode of transistor 190 is connected to the cathode electrode of a driver tube 210. The plate electrode of the driver tube 210 is connected to the input terminal of the amplifier output stage 118 and is also connected to ground 128 via a plate load resistor 212. In addition, a transistor current source 214 having a substantially constant current, $I_3$, is connected between the plate electrode of the driver 210 and the output terminal of the amplifier 118.

The resistance values of resistors 208 and 196 are selected to establish a predetermined current gain relative to the collector current of transistor 190 and the current flowing into the input terminal of the current limiter stage 116. Specifically, these resistors are selected such that during quiescent operation the collector current in transistor 190 is substantially equal to the current $I_3$ (supplied by current source 214) when the current flowing into the current limiting stage 116 is equal to $I_1-I_2$. Thus in the operation of current limiting stage 116, when the signal voltage $V_2$ (at the input terminal of the E-I converter 116) is zero, essentially all of the current developed by transistor current source 214 flows through the driver tube 210 and substantially no net current output $I_x$ flows from the current limiter 116.

As the signal voltage $V_2$ causes the collector current of transistor 172 to decrease, below the quiescent value $I_1-I_2$ current flows through resistor 196 of the current limiter stage, in turn causing the collector current in transistor 190 to decrease below the value $I_3$. Accordingly, the current flow through the driver tube 210 decreases and a current $I_x$ flows from the output terminal of the current limiter stage 116. When the collector current of transistor 172 is equal to or less than approximately $I_2$, transistor 188 is cut off in turn causing the current flow through the driver tube 210 to be substantially equal to zero. Hence, when the collector current of transistor 172 is less than or equal to $I_2$, the current limiter stage 116 limits the current supplied to capacitor 154 substantially constant and equal to $I_3$.

For input signals $V_2$ that cause the collector current of transistor 172 to increase or decrease relative to the quiescent value of $I_1$ the current coupled through the resistor 186 of the current limiter stage 116 causes a corresponding increase or decrease in the current flowing through the driver tube 210. Thus a current, $I_x$, equal to the difference between the current through the driver tube 210 and current $I_3$ is supplied to the output terminal of the current limiter stage 116.

As previously stated, the resistors 200 and 202 are selected so as to control the maximum DC potential at the collector electrode of transistor 188. More specifically, these resistors are selected such that when the current flowing into the input terminal of the current limiter stage 116 becomes equal to $2(I_1-I_2)$, transistor 188 saturates. Since the current gain of the current limiter stage 116 is set such that an input current of $I_1-I_2$ produces a driver tube current of $I_3$, and transistor 188 saturates when the input current is $2(I_1-I_2)$, positive input currents equal to or greater than $2(I_1-I_2)$ produce a current through the driver tube 210 of $2I_3$. Accordingly, it can be seen that the current limiter stage 116 depicted in FIG. 3 supplies an output current limited to $\pm I_3$ amps, and supplies an output current having a value within the range of $-I_3$ to $+I_3$ amps that is linearly related to the applied input current. It will be noted that, although the current limiter circuit 16 of the embodiment of FIG. 1 did not supply current gain, the circuit equations discussed with respect to FIG. 1 are applicable to the circuit embodiment of FIG. 2 by considering the current gain of the current limiter 116 as a portion of the transconductance, $g_m$, of the E-I converter 114.

In the detector circuit 156 depicted in FIG. 3, transistors 216 and 218 are connected as a conventional differential amplifier stage with the base electrode of transistor 216 connected to detector terminal 134 and the base electrode of transistor 218 connected to the detector terminal 132. Emitter resistors 220 and 222 are substantially equal in resistance value and are commonly connected to a current source 224. The current source 224, which is connected from the junction between resistors 220 and 222 and a bias terminal 230, supplies a substantially constant bias current $I_4$ with essentially one-half of the bias current flowing through each of the transistors 216 and 218. Capacitors 226 and 228, respectively connected between the circuit ground potential 128 and the emitter electrodes of transistors 216 and 218, decrease the common mode rejection of the differential amplifier stage to increase the gain of the differential amplifier stage at higher frequencies. This increase in high frequency gain increases the sensitivity of detector circuit 156 at frequencies outside the normal operating range of the amplifier. The collector electrodes of transistors 216 and 218 are respectively connected to bias terminal 180 by current sources 232 and 234, each of which supply a substantially constant bias current $I_5$ that is greater than $I_4 2$. Thus, when no signal is developed between detector terminals 132 and 134, a current substantially equal to $I_5$ minus $I_4/2$ flows through each of the diodes 236 and 238 that are respectively connected between a bias terminal 240 and the collector electrodes of transistors 216 and 218.

Transistors 242 and 244 are connected with the base electrodes respectively connected to the collector electrodes of transistors 218 and 216, the emitter electrodes commonly connected to the bias terminal 240, and the collector electrodes commonly connected to the trigger input of the monostable multivibrator stage 164. Transistors 242 and 244 are respectively biased in the nonconducting state since the current flowing through diodes 236 and 238 reverse biases the transistor base-to-emitter junctions. Transistors 242 and 244 are respectively driven into conduction in response to negative or positive detection signals developed between detection terminals 132 and 134 to trigger monostable multivibrator 164. The triggering of monostable multivibrator 16, in turn, disconnects the amplifier input signal. For example, if the detection signal at detection terminal 134 is substantially positive with respect to the detection signal at detection terminal 132, the collector current of transistor 216 increases causing the current flow through diode 238 to become substantially equal to zero and transistor 244 will conduct to trigger the monostable multivibrator 164.

The output of the detector circuit 156 of FIG. 3 is coupled to the base electrode of transistor 248 of the monostable multivibrator 164 via a voltage divider formed by resistors 250 and 252. In the depicted embodiment of the monostable multivibrator 164, the collector electrode of transistor 248 is connected to bias terminal 180 via resistor 254 and the emitter electrode of transistor 248 is connected to the emitter electrode of transistor 246 and is also connected to bias terminal 230 via resistor 256. The collector electrode of transistor 246 is directly connected to bias terminal 180. The base electrode of transistor 246 is connected to the junction of a series connected resistor 258 and a diode 260 that are connected between bias terminals 240 and the circuit ground 128. In the absence of an output signal from the detector circuit 156, transistor 246 is biased in the conducting state by the current flow through diode 260 to, in turn, maintain transistor 248 in a nonconducting state. When a trigger signal is coupled to the base electrode of transistor 248 from the output terminal of detector circuit 156, transistor 248 is driven into conduction. As transistor 248 begins to conduct the decrease in the collector voltage of transistor 248 is coupled to the base electrode of transistor 246 via capacitor 262 to switch transistor 246 into the nonconducting stage. Capacitor 262 then charges through resistors 254 and 258 to return transistor 246 to the conducting state and transistor 248 to the nonconducting state. The decrease in the voltage at the collector electrode of transistor 248 is also connected to the input terminal of switch driver circuit 166 to activate analog switch 170 and thereby disconnect the input signal from the amplifier input terminal 120 during the period of time in which transistor 248 remains in conduction.

The switch driver circuit 166 depicted in FIG. 3 is arranged to supply positive control voltage to the gate electrode of analog switching FET 170 whenever the amplifier operation is linear and a negative voltage to the gate electrode of FET 170 whenever the operation is non-linear. Further, the switch driver circuit of FIG. 3 includes a temperature compensation circuit that maintains the drain to source resistance of the analog switching FET 170 effectively constant with temperature to thereby prevent temperature induced gain variations in the overall circuit gain.

The negative gate potential utilized to switch FET 170 into a nonconducting state is supplied by transistor 262 and 264 in response to an output signal coupled from the output terminal of monostable multivibrator 164 to the base electrode of transistor 262. The emitter electrode of transistor 262 is connected to the bias terminal 180 via a resistor 266 and the collector electrode of transistor 262 is connected to the base electrode of transistor 264 and is also connected to a bias terminal 268 via a resistor 270. A negative bias potential is applied to the bias terminal 268 and the resistance values of resistors 266 and 270 are selected such that transistor 262 will conduct only when an input signal is received from the monostable multivibrator 164. When transistor 262 is switched to a conducting state by multivibrator 164, current is supplied to the base electrode of transistor 262, which, in turn, causes transistor 264 to conduct. The collector electrode of transistor 264 is connected to the gate electrode of the analog switching FET 170 via resistor 272, and the emitter electrode of transistor 264 is connected to the negative bias terminal 268. Thus as transistor 264 begins to conduct, the FET gate potential becomes negative with the time constant of resistor 272 and capacitor 283, connected between ground potential 126 and the FET gate electrode, established to rapidly switch FET 170 into the nonconducting state.

At the conclusion of the output signal supplied by the multivibrator circuit 164, the capacitor 283 discharges through resistor 278, which has a substantially higher resistance value than that of resistor 274, to slowly return the FET to the conducting state.

A positive potential to maintain FET 170 in the conducting state when the amplifier 110 is operating linearly is applied to the gate electrode of FET 170 via resistor 274. Although in some embodiments an appropriate constant positive potential could be directly coupled to the gate electrode of FET 170 via resistor 274, it is advantageous to establish the positive gate potential such that the FET gate potential varies with temperature to maintain the drain to source resistance of FET 170 effectively constant with respect to temperature. This features ensures that the overall circuit gain will remain relatively constant with temperature, since, as previously noted, the drain to source resistance of FET 170 is effectively connected in series with the gain determining resistor 138.

In the temperature compensation circuit of the switch driver circuit 166 of FIG. 3, the source and drain electrodes of FET 276, are respectively connected to circuit ground 128 and to bias terminal 180 via resistor 278. The FET 276 is a transistor having performance characteristics substantially identical to the performance characteristics of FET 170. Preferably, FET 170 and FET 276 are mounted in close proximity to one another so that each FET is exposed to the same ambient temperature. In addition, the substrate electrodes of FET 170 and 276 are connected to identical regative bias potential (not shown in FIG. 3). Resistor 278 establishes a predetermined current flow through the FET 278 source to drain path. This current establishes a voltage at the interconnection between resistor 278 and the FET 276 that is coupled to the noninverting input terminal of an operational amplifier 280. The input voltage at the inverting input of the operational amplifier 280 is determined by voltage divider resistors 282 and 284 that are series connected between the bias terminal 180 and the circuit ground 128. The resistance values of resistors 282 and 284 are established such that, at some reference temperature, the DC voltage at the output terminal of the operational amplifier 280 produces the desired drain to source resistance in the analog switching FET 170. Since the output terminal of the operational amplifier 280 is connected to the gate electrode of the temperature compensating FET 276 and the drain to source characteristics of FETs 170 and 276 are substantially identical, it can be seen that temperature induced changes in the FET drain to source resistances will cause the output voltage of operational amplifier 280 to change in a manner than tends to maintain a constant drain to source resistance in both FET 170 and FET 276. For example, if the drain to source resistance of the FETs decreases due to a temperature change, the voltage at the noninverting input terminal of operational amplifier 280 decreases causing a corresponding decrease in the operational amplifier output voltage. The decrease in the output voltage of the operational amplifier in turn decreases the gate potentials of FETs 170 and 276 to thereby increase the drain to source resistance to substantially the original value. In a like manner, a temperature induced increase in the FET drain to source resistance increases the FET gate potentials to decrease the drain to source resistance to substantially the original value.

What is claimed is:

1. An amplifier circuit having an input terminal for receiving electrical signals, an output terminal for supplying the signal produced by said amplifier circuit and means including first and second detection terminals operable for supplying a signal indicative of non-linear operation of said amplifier circuit comprising:
   first amplification means, having an output terminal and an input terminal connected to said amplifier input terminal;
   means for supplying a signal to said first detection terminal that is proportional to the signal applied to said amplifier circuit input terminal;
   voltage-to-current converter means for supplying a current proportional to the output signal voltage at said output terminal of said first amplification means;
   current limiter means having an input terminal and responsive to the current supplied by said voltage-to-current converter means, said current limiter means having an output terminal and operable for supplying a first predetermined positive current when said current supplied by said voltage-to-current converter means is positive and of a magnitude that exceeds a predetermined value, and for supplying a second predetermined negative current when said current supplied by said voltage-to-current converter means is negative and of a magnitude that exceeds a predetermined value;
   circuit means including a first capacitor, said circuit means connected between the output terminal of said current limiter means and a terminal of fixed potential;
   second amplification means having an input terminal connected to said output terminal of said current limiter means, and an output terminal connected to said amplifier circuit output terminal, said second amplification means altering the current flow through said capacitor of said circuit means when said second amplification means operates nonlinearly; and
   means responsive to the current flow through said first capacitor of said circuit means for supplying a signal to said second detection terminal that is proportional to said current flow through said capacitor.

2. The amplifier circuit of claim 1, wherein said means for supplying said signal to said first detection terminal includes an electrical connection between said first detection terminal and said output terminal of said first amplifier means.

3. The amplifier circuit of claim 1, wherein said circuit means including said first capacitor comprises said first capacitor serially connected with a resistor, said first capacitor connected to said output terminal of said current limiter and said resistor connected to said terminal of fixed potential.

4. The amplifier circuit of claim 3, wherein said means responsive to the current flow through said first capacitor for developing said signal at said second detection terminal includes an electrical connection between said second detection terminal and the junction between said first capacitor and said resistor.

5. The amplifier circuit of claim 1, wherein said means responsive to the current flow through said first capacitor for developing said signal at said second detection terminal includes a second capacitor and resistor serially connected from said output terminal of said second amplification means to said terminal of fixed potential with the junction between said second capacitor and said resistor electrically connected to said second detection terminal.

6. An operational amplifier circuit having an input terminal and an output terminal, said operational amplifier supplying a detection signal when the operation of said amplifier is nonlinear comprising:
   a voltage amplification stage having an input terminal and an output terminal, said input terminal of said voltage amplification stage connected to said operational amplifier input terminal;
   a voltage-to-current converter stage having an input terminal and an output terminal and a transconductance parameter $g_m$, said input terminal of said voltage-to-current converter stage connected to said output terminal of said voltage amplification stage, said voltage-to-current converter stage supplying a current at said output terminal substantially equal to the signal voltage at said output terminal of said voltage amplification stage multiplied by said transconductance parameter $g_m$;
   a current limiter stage having an input terminal and an output terminal, the input terminal of said current limiter stage connected to the output terminal of said voltage-to-current converter stage, said current limiter stage supplying an output current of a magnitude $I_p$ in response to currents supplied by said voltage-to-current converter stage that exceed a predetermined magnitude, said current limiter stage supplying a current proportional to those currents supplied by said voltage-to-current converter stage that are less than said predetermined magnitude;
   a first capacitor connected between said output terminal of said current limiter stage and a terminal of fixed potential, said capacitor establishing the maximum slew rate of said operational amplifier substantially equal to $I_p$ divided by the capacitance value of said first capacitor;
   an output amplification stage having an input terminal and an output terminal and a voltage gain $A_p$, said input terminal of said output amplification stage connected to said output terminal of said current limiter stage, said output terminal of said output amplification stage connected to said operational amplifier output terminal;
   means for supplying a first signal proportional to the signal applied to said operational amplifier input terminal; and
   means for supplying a second signal proportional to the current flow through said first capacitor;
   signal detection means responsive to said first and second signals for supplying said detection signal, said signal detection means supplying said detection signal when said applied input signal requires the output signal of said operational amplifier to slew at a slew rate greater than $I_p$ divided by the capacitance value of said first capacitor said signal detection means further supplying said detection signal when non-linear operation of said output amplification stage causes current flow between the output terminal of said current limiter stage and the input terminal of said output amplification stage.

7. The operational amplifier circuit of claim 6, wherein said means for supplying a second signal proportional to said current flow through said first capacitor includes a resistor serially connected with said first capacitor with said first capacitor connected to said output terminal of said current limiter stage and said resistor connected to said terminal of fixed potential, said second signal proportional to said current flow through said first capacitor being supplied as the signal voltage across said resistor.

8. The operational amplifier circuit of claim 7, further comprising a first detection terminal electrically connected to said output terminal of said voltage amplification stage and a second detection terminal electrically connected to the junction between said resistor and said first capacitor, said first and second detection terminals respectively supplying said first and second signals, said detection signal being supplied as the signal voltage between said first and second detection terminals.

9. The operational amplifier circuit of claim 8, wherein said current limiter stage supplies an output current substantially equal to the current supplied by said current-to-voltage converter stage for all currents of said magnitude less than said predetermined current magnitude and the resistance value of said resistor is substantially equal to the reciprocal of said voltage-to-current converter stage transconductance parameter $g_m$.

10. The operational amplifier circuit of claim 6, wherein said means for supplying a signal proportional to said current flow through said first capacitor includes a series connected second capacitor and resistor, said second capacitor being connected to the output terminal of said output stage and said resistor being connected to said terminal of fixed potential, said signal proportional to said current flow through said first capacitor being supplied as the signal voltage across said resistor.

11. The amplifier circuit of claim 10, further comprising a first detector terminal electrically connected to said output terminal of said voltage amplification stage and a second detection terminal electrically connected to the junction between said second capacitor and said resistor, said first and second detection terminals respectively supplying said first and second signals, said detection signal being supplied as the signal voltage between said first and second detection terminals.

12. The operational amplifier circuit of claim 11, wherein said current limiter stage supplies an output current substantially equal to the current supplied by said voltage-to-current converter stage for all currents of said magnitude less than said predetermined current magnitude and the resistance value of said resistor is substantially equal to the reciprocal of said voltage to current converter stage transconductange parameter $g_m$ multiplied by the reciprocal of the gain $A_v$ of said output amplification stage.

13. An amplifier circuit having an input terminal and an output terminal, said amplifier including means for interrupting the input signal applied to said input terminal of said amplifier whenever said applied input signal causes said amplifier to operate nonlinearly comprising:

a first resistor, one terminal of said first resistor connected to said input terminal of said amplifier;
an analog switch having an input terminal, an output terminal and a control terminal, said input terminal of said analog switch connected to the second terminal of said first resistor, the electrical conductance between said analog switch input and output terminals controllable between a conducting state and a nonconducting state in response to a signal applied to said control terminal;
a first amplification stage, having an output terminal and an input terminal connected to said output terminal of said analog switch;
a voltage-to-current converter stage having an output terminal and an input terminal connected to said output terminal of said first amplification stage, said voltage-to-current converter stage supplying a current proportional to the output voltage at said output terminal of said first amplification stage;
a current limiter stage responsive to the current supplied by said voltage-to-current converter stage, said current limiter stage supplying a predetermined positive current when said current supplied by said voltage-to-current converter stage is positive and of a magnitude that exceeds a predetermined value, said current limiter stage supplying a predetermined negative current when said current supplied by said voltage-to-current converter stage is negative and of a magnitude that exceeds a predetermined value;
a first capacitor connected between said output terminal of said current limiter stage and a first terminal of fixed potential;
an output amplification stage connected between said output terminal of said current limiter stage and said output terminal of said amplifier circuit, said output amplification stage altering the current flow through said first capacitor current flows into said input terminal of said output amplification stage due to nonlinear operation of said output amplification stage;
a second resistor connected between said output terminal of said amplifier circuit and said input terminal of said first amplification stage;
first circuit means for supplying a first signal proportional to the input signal applied to said input terminal of said amplifier circuit;
second circuit means for supplying a second signal proportional to said current flow through said second capacitor;
detection means responsive to said first and second signals for supplying a trigger signal whenever nonlinear operation of said output amplification stage alters the current flow through said first capacitor, said detection means further supplying said trigger signal whenever said signal applied to said amplifier input terminal exceeds the maximum slew rate of said amplifier circuit to cause said current limiter stage to supply said first and said second predetermined currents;
multivibrator means having an input terminal responsive to said trigger signal, said multivibrator means having an output terminal for supplying a switching signal of predetermined time duration each time said detection means supplies a trigger signal, and
switch driving means responsive to said multivibrator switching signal for supplying a first control signal to said control terminal of said analog switch, said first control signal maintaining said switch in said nonconductive state for the duration of said multivibrator switching signal, said switch driving means including means for supplying a second control signal to said control terminal of said analog switch for maintaining said analog switch in said conducting state whenever said multivibrator switching signal is not supplied.

14. The amplifier circuit of claim 13 further comprising an indicator circuit responsive to said multivibrator output signal for supplying a humanly perceivable indication whenever said applied input signal causes nonlinear operation of said amplifier circuit.

15. The amplifier circuit of claim 13, wherein said circuit means for supplying a second signal proportional to the current flow through said capacitor includes a serially connected second capacitor and a second resistor, said second capacitor connected to said output terminal of said output amplification stage, said third resistor connected to said first terminal of fixed potential, said second signal being supplied as the voltage across said third resistor.

16. The amplifier circuit of claim 15, wherein said voltage-to-current converter stage comprises:
a first transistor having the base electrode connected to said output terminal of said first amplification stage;
a first current source having a first terminal connected to a second terminal of fixed potential, said first current source having a second terminal connected to the emitter electrode of said first transistor;
a zener diode having a cathode electrode connected to the collector electrode of said first transistor, said zener diode having an anode electrode connected to said input terminal of said current limiter stage; and
a second current source having a first terminal connected to said collector electrode of said first transistor, said second current source having a second terminal connected to a third terminal of fixed potential.

17. The amplifier circuit of claim 16, wherein said first circuit means for supplying a first signal proportional to said signal applied to said amplifier circuit comprises a fourth and fifth resistor, said fourth and fifth resistors respectively connected in series between said emitter electrode of said first transistor and said first terminal of fixed potential, said first signal being supplied as the voltage across said fifth resistor.

18. The amplifier circuit of claim 17, wherein said current limiter stage comprises:
a second transistor having a base electrode connected to said anode of said zener diode;
first and second diodes and a sixth resistor respectively connected in series between said base electrode of said second transistor and a fourth terminal of fixed potential;
a seventh resistor connected between the collector electrode of said second transistor and a fifth terminal of fixed potential;
an eighth resistor connected between said collector electrode of said second transistor and said first terminal of fixed potential;
a third transistor having a base electrode connected to the emitter electrode of said second transistor;
a third diode and a ninth resistor serially connected between said base electrode of said second transistor and said fourth terminal of fixed potential;
a 10th resistor connected between the emitter electrode of said third transistor and said fourth terminal of fixed potential;
a vacuum tube having a cathode electrode connected to the collector electrode of said third transistor, said vacuum tube having a grid electrode connected to said fourth terminal of fixed potential;
an 11th resistor connected between said first terminal of fixed potential and the plate electrode of said vacuum tube; and
a third current source connected between the output terminal of said output amplification stage and said plate electrode of said vacuum tube.

19. The amplifier circuit of claim 18, wherein said detection means comprises:
fourth, fifth, sixth and seventh transistors having a base electrode, an emitter electrode and a collector electrode, the collector electrodes of said fourth and fifth transistors respectively connected to the base electrodes of said sixth and seventh transistors, the base electrode of said fourth transistor connected to the junction between said third resistor and said first capacitor, the base electrode of said fifth transistor connected to the junction between said fourth and fifth resistors, the emitter electrodes of said sixth and seventh transistors commonly connected to a sixth terminal of fixed potential, the collector electrodes of said sixth and seventh transistors commonly connected to said input terminal of said multivibrator means;
fourth and fifth current sources having first terminals commonly connected to a seventh terminal of fixed potential, said fourth and fifth current sources having second terminals respectively connected to said collector electrodes of said fourth and fifth transistors;
12th and 13th resistors serially connected between said emitter electrodes of said fourth and fifth transistors;
third and fourth capacitors respectively connected between said first terminal of fixed potential and said emitter electrodes of said fourth and fifth transistors;
a sixth current source having a first terminal connected to an eighth terminal of fixed potential, said sixth current source having a second terminal connected to the junction between said 12th and 13th resistors; and
fourth and fifth diodes having cathode electrodes commonly connected to said sixth terminal of fixed potential, said fourth and fifth diodes having anode electrodes respectively connected to said base electrodes of said sixth and seventh transistors.

20. The amplifier circuit of claim 19, wherein said analog switch is a first metal oxide field effect transistor having a source electrode, a drain electrode and a gate electrode, said source electrode connected to said first resistor, said drain electrode connected to said input terminal of said first amplification stage.

21. The amplifier circuit of claim 20, wherein said switch driving means comprises:
eighth and ninth transistors having a base electrode, an emitter electrode and a collector electrode, the base electrode of said eighth transistor connected to said output terminal of said multivibrator means, said collector electrode of said eighth transistor connected to said base electrode of said ninth transistor, said emitter electrode of said ninth transistor connected to a ninth terminal of fixed potential;
a 14th resistor connected between said base electrode of said ninth transistor and said ninth terminal of fixed potential;
a 15th resistor connected between said emitter electrode of said eighth transistor and said seventh terminal of fixed potential;

a 16th resistor connected between said collector electrode of said nith transistor and said gate electrode of said first metal oxide field effect transistor;

a fifth capacitor connected between said gate electrode of said first metal oxide field effect transistor and said first terminal of fixed potential;

a summing amplifier circuit having a noninverting input terminal, an inverting input terminal and an output terminal;

a 17th resistor connected between said output terminal of said summing amplifier and said gate electrode of said first metal oxide field effect transistor;

an 18th resistor connected between said summing amplifier noninverting input terminal and said seventh terminal of fixed potential;

19th and 20th resistors series connected between said seventh terminal of fixed potential and said first terminal of fixed potential, the junction between said 19th and 20th resistors connected to said summing amplifier inverting input terminal; and a second metal oxide field effect transistor having a gate electrode connected to said output terminal of said summing amplifier, said second metal oxide field effect transistor having a source electrode connected to said summing amplifier noninverting input terminal, said second metal oxide field effect transistor having a drain electrode connected to said first terminal of fixed potential.

* * * * *

UNITED STATES PATENT AND TRADEMARK OFFICE
CERTIFICATE OF CORRECTION

PATENT NO. : 4,006,428
DATED : February 1, 1977
INVENTOR(S) : Donald G. Meyer et al.

It is certified that error appears in the above-identified patent and that said Letters Patent are hereby corrected as shown below:

Column 9, line 47, delete the second occurrence of the word "cannot" and insert therefor --amplifier--.

Signed and Sealed this

Twelfth Day of April 1977

[SEAL]

Attest:

RUTH C. MASON
*Attesting Officer*

C. MARSHALL DANN
*Commissioner of Patents and Trademarks*